United States Patent
Paseuth et al.

(10) Patent No.: US 9,216,456 B2
(45) Date of Patent: Dec. 22, 2015

(54) SURFACE-COATED CUTTING TOOL AND METHOD OF MANUFACTURING THE SAME

(71) Applicant: Sumitomo Electric Hardmetal Corp., Itami-shi (JP)

(72) Inventors: Anongsack Paseuth, Itami (JP); Keiichi Tsuda, Itami (JP); Susumu Okuno, Itami (JP); Hideaki Kanaoka, Itami (JP); Takahiro Ichikawa, Itami (JP); Hiroyuki Morimoto, Itami (JP); Minoru Itoh, Sorachi-gun (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 0 days.

(21) Appl. No.: 14/430,790

(22) PCT Filed: Jun. 27, 2013

(86) PCT No.: PCT/JP2013/067656
§ 371 (c)(1),
(2) Date: Mar. 24, 2015

(87) PCT Pub. No.: WO2014/054320
PCT Pub. Date: Apr. 10, 2014

(65) Prior Publication Data
US 2015/0258611 A1    Sep. 17, 2015

(30) Foreign Application Priority Data
Oct. 2, 2012    (JP) .................................. 2012-220509

(51) Int. Cl.
| C23C 16/00 | (2006.01) |
| B23B 27/14 | (2006.01) |
| C23C 30/00 | (2006.01) |
| C23C 16/38 | (2006.01) |

(52) U.S. Cl.
CPC .................. B23B 27/14 (2013.01); C23C 16/38 (2013.01); C23C 30/005 (2013.01); B23B 2228/04 (2013.01); B23B 2228/105 (2013.01)

(58) Field of Classification Search
USPC .................... 51/307, 309; 428/216, 336, 704; 427/255.31, 255.39, 255.391
See application file for complete search history.

(56) References Cited

U.S. PATENT DOCUMENTS

| 4,019,873 A |   | 4/1977  | Reiter |
| 4,268,582 A | * | 5/1981  | Hale ..................... B23B 27/148 |
|             |   |         | 428/472 |
| 4,436,775 A | * | 3/1984  | Graham ................ C23C 30/005 |
|             |   |         | 427/255.7 |
| 2004/0016329 A1 |   | 1/2004 | Holzschuh |
| 2010/0279093 A1 |   | 11/2010 | Wallgram et al. |
| 2011/0262233 A1 |   | 10/2011 | Martensson |

FOREIGN PATENT DOCUMENTS

| GB | 1408294      | * 10/1975 |
| JP | 51-148713 A  | 12/1976   |
| JP | 03-64472 A   | 3/1991    |
| JP | 2004-001215 A | 1/2004   |
| JP | 2011-505261 A | 2/2011   |
| JP | 2012-507625 A | 3/2012   |

OTHER PUBLICATIONS

Pfohl et al "Devlopment of titanium diboride coatings deposited by PACVD" Surface & Technolgy 131 (2000) p. 141-146.*
Caputo et al "Chemical Vapor Depostion of Erosion-Resistant TiB2 Coatings", J.Electrochem Soc. (1985) p. 2274-2280.*
Takahashi et al "Ultrasonic Chemical Vapor Depostion of TiB2 Thick Films" Journal of Crystal Growth 49 (1980) p. 445-450.*
Pierson et al "Titanium Diboride Coatings and their Reaction with the Substrates". Thin Solid Films 54 (1978) p. 119-128.*
Paseuth et al., U.S. Appl. No. 14/430,806, "Surface-Coated Cutting Tool and Method of Manufacturing the Same," filed Mar. 24, 2015.
International Search Report in PCT International Application No. PCT/JP2013/067656, dated Aug. 6, 2013.
International Search Report in PCT International Application No. PCT/JP2013/067657, dated Aug. 6, 2013.

* cited by examiner

*Primary Examiner* — Archene Turner
(74) *Attorney, Agent, or Firm* — Venable LLP; Michael A. Sartori

(57) ABSTRACT

A surface-coated cutting tool of the present invention includes a base material and a coating film formed on the base material. The coating film includes at least one $TiB_2$ layer. The $TiB_2$ layer includes Cl together with $TiB_2$. This surface-coated cutting tool is characterized in that assuming that in the $TiB_2$ layer, a first region represents a region having a thickness of 0.5 µm from an interface on the base material side, and a second region represents a region having a thickness of 0.5 µm from an interface on the coating film surface side, an atomic ratio Cl/(Ti+Cl) between Ti and Cl is higher in the second region than in the first region.

4 Claims, No Drawings

SURFACE-COATED CUTTING TOOL AND METHOD OF MANUFACTURING THE SAME

TECHNICAL FIELD

The present invention relates to a surface-coated cutting tool including a base material and a coating film formed on the base material, and a method of manufacturing the surface-coated cutting tool.

BACKGROUND ART

Conventionally, there is a known surface-coated cutting tool including a base material and a coating film formed on the base material, in which a $TiB_2$ layer is included as the coating film.

For example, Japanese Patent Laying-Open No. 51-148713 (PTD 1) discloses a wear-resistant molding member comprising a cemented carbide base body and a surface layer that is formed of two laminated partial layers including an outer partial layer made of aluminum oxide and/or zirconium oxide, and an inner partial layer made of one or more types of borides, particularly, diboride that is an element of titanium, zirconium, hafnium or the like (that is, a $TiB_2$ layer).

The inner partial layer of the above-described surface layer forms a $TiB_2$ layer of 3 μm that is obtained under high-temperature and high-vacuum conditions of 1000° C. and 50 torr by introducing hydrogen at 1900 l/hour, $TiCl_4$ at 20 ml/hour and $BCl_3$ at 4 g/hour each as reactive raw material gas, and forming a film for one hour. Also, the outer partial layer forms an aluminum oxide layer of 5 μm.

However, under the high-temperature and high-vacuum conditions during the film formation as mentioned above, diffusion of boron in a junction layer and a $TiB_2$ layer into the cemented carbide base body causes production of a strong η layer and/or a boron-containing brittle layer, thereby significantly reducing the lifetime of this wear-resistant molding member.

For the purpose of solving the above-described problems, a coated product is proposed that is improved in wear resistance by suppressing diffusion of boron and finely granulating $TiB_2$ in the $TiB_2$ layer (Japanese Patent National Publication No. 2011-505261 (PTD 2)). This coated product is formed by coating the surface of the cemented carbide base material with a layer of 0.1 μm to 3 μm made of a group of titanium nitride, titanium carbonitride and titanium boron carbonitride, and then, forming a $TiB_2$ layer of 1 μm to 5 μm. The conditions of forming the $TiB_2$ layer of various layers mentioned above are as follows. Specifically, a $TiB_2$ layer having a thickness of 2.5 μm is formed by the thermal CVD method for 1 hour at a standard pressure and at a temperature of 800° C., using a raw material gas composition including 10% by volume of hydrogen, 0.4% by volume of $TiCl_4$, 0.7% by volume of $BCl_3$, and 88.9% by volume of argon gas. In this coated product, a boron-containing brittle layer caused by diffusion of boron into the cemented carbide base material is not formed, and the particle size of $TiB_2$ in the $TiB_2$ layer is also controlled to be 50 nm or lower, so that the lifetime of the tool is improved to some extent.

CITATION LIST

Patent Document

PTD 1: Japanese Patent Laying-Open No. 51-148713
PTD 2: Japanese Patent National Publication No. 2011-505261

SUMMARY OF INVENTION

Technical Problem

As described above, the coated product in ID 2 is improved in lifetime of the tool to some extent. However, attention is paid only on suppression of formation of a strong η layer and/or a boron-containing brittle layer, or on control of the particle size of $TiB_2$ in the $TiB_2$ layer. Accordingly, there are limitations in further improving the performance of the $TiB_2$ layer, so that consideration from another point of view has been required.

Furthermore, as in the case where such a coated product is used to process a Ti-based alloy that is a difficult-to-cut material, particularly in the process in which the temperature of the cutting edge tends to rise, and in the process in which the cutting edge of the tool tends to undergo stress concentration and vibration due to the specific shape of scraps (saw-blade shape), the lifetime of the tool may be significantly reduced due to chipping of the cutting edge, and thus, further improvement in chipping resistance has been required.

The present invention has been made in light of the above-described circumstances. An object of the present invention is to provide a surface-coated cutting tool including a $TiB_2$ layer as a coating film and highly improved in wear resistance and chipping resistance.

Solution to Problem

As a result of concentrated studies for solving the above-described problems, the inventors of the present invention have found that it is important for improvement in chipping resistance to control the concentration of chlorine included in the $TiB_2$ layer. Then, upon conducting further studies based on this knowledge, they completed the present invention.

Specifically, a surface-coated cutting tool according to the present invention includes a base material and a coating film formed on the base material. The coating film includes at least one $TiB_2$ layer. This $TiB_2$ layer includes Cl together with $TiB_2$. Assuming that in the $TiB_2$ layer, a first region represents a region having a thickness of 0.5 μm from an interface on the base material side, and a second region represents a region having a thickness of 0.5 μm from an interface on the coating film surface side, an atomic ratio Cl/(Ti+Cl) between Ti and Cl is higher in the second region than in the first region.

In this case, it is preferable that the atomic ratio Cl/(Ti+Cl) is 0.00001 to 0.001 in the first region, and is 0.0001 to 0.01 in the second region. It is preferable that the $TiB_2$ layer has a thickness of 1 to 10 μm.

Furthermore, the present invention also relates to a method of manufacturing a surface-coated cutting tool including a base material and a coating film formed on the base material, in which the coating film includes at least one $TiB_2$ layer. The method includes the step of forming the $TiB_2$ layer. The step is a step of forming the $TiB_2$ layer with a chemical vapor deposition method by using a raw material gas including at least $TiCl_4$ and $BCl_3$, and is characterized in that a molar ratio $TiCl_4/BCl_3$ between the $TiCl_4$ and the $BCl_3$ in the raw material gas is lower than 0.6 at the start of the step, and is equal to or higher than 0.6 at the end.

Advantageous Effects of Invention

The surface-coated cutting tool according to the present invention achieves an excellent effect of greatly improving wear resistance and chipping resistance.

DESCRIPTION OF EMBODIMENTS

The present invention will be hereinafter described in greater detail.

<Surface-Coated Cutting Tool>

The surface-coated cutting tool according to the present invention has a configuration including a base material and a coating film formed on the base material. It is preferable that such a coating film covers the entire surface of the base material. However, even if a part of the base material is not covered by this coating film or the configuration of the coating film is partially different, such a structure does not deviate from the scope of the present invention.

The above-described surface-coated cutting tool according to the present invention can be suitably used as a cutting tool such as a drill, an end mill, a cutting edge replaceable-type cutting tip for a drill, a cutting edge replaceable-type cutting tip for an end mill, a cutting edge replaceable-type cutting tip for milling, a cutting edge replaceable-type cutting tip for turning, a metal saw, a gear cutting tool, a reamer, and a tap.

<Base Material>

As the base material used for the surface-coated cutting tool according to the present invention, any material can be used as long as it is conventionally known as the above-described type of base material. For example, the base material is preferably any one of cemented carbide (for example, WC-based cemented carbide or a material containing WC and Co or carbonitride of Ti, Ta, Nb or the like), cermet (mainly composed of TiC, TiN, TiCN, or the like), high-speed steel, ceramics (titanium carbide, silicon carbide, silicon nitride, aluminum nitride, aluminum oxide, and the like), a cubic boron nitride sintered body, a diamond sintered body, and the like.

Among these various base materials, particularly, it is preferable to select WC-based cemented carbide and cermet (particularly, TiCN-based cermet). This is because these base materials are excellent in balance between the hardness and the strength particularly at a high temperature, and have excellent characteristics as a base material of the surface-coated cutting tool for the above-described use.

In the case where the surface-coated cutting tool is a cutting edge replaceable-type cutting tip or the like, the base material in this case may be those having a chip breaker or not having a chip breaker, and a cutting-edge ridgeline portion may be shaped in any of a sharp edge (a ridge in which a rake face and a flank face cross each other), honing (obtained by processing a sharp edge so as to have curve (R)), a negative land (obtained by beveling), and a combination of honing and a negative land.

<Coating Film>

The coating film of the present invention may include other layers as long as it includes at least one $TiB_2$ layer. Examples of other layers may include an $Al_2O_3$ layer, a TiN layer, a TiCN layer, a TiBNO layer, a TiCNO layer, a TiAlN layer, a TiAlCN layer, a TiAlON layer, a TiAlONC layer, and the like. In the present invention, in the case where the compositions of layers other than the $TiB_2$ layer are expressed by chemical formulae such as "TiN" and "TiCN" and in the case where the atomic ratio is not particularly specified in the chemical formulae, it is not assumed that the atomic ratio of each element is only "1", but assumed that all of conventionally-known atomic ratios are included.

Such a coating film according to the present invention serves to cover the base material to achieve an effect of improving several characteristics such as wear resistance and chipping resistance.

It is suitable that such a coating film of the present invention has a thickness of 2 µm to 20 µm, more preferably, 5 µm to 15 µm. When the thickness is less than 2 µm, the wear resistance may be insufficient. When the thickness exceeds 20 µm, the coating film may be peeled off or broken with great frequency when relatively strong stress is applied between the coating film and the base material during the intermittent process.

<$TiB_2$ Layer>

The $TiB_2$ layer included in the coating film of the present invention is characterized in that the $TiB_2$ layer includes Cl (chlorine) together with $TiB_2$, and assuming that in the $TiB_2$ layer, a first region represents a region having a thickness of 0.5 µm from an interface on the base material side, and a second region represents a region having a thickness of 0.5 µm from an interface on the coating film surface side, an atomic ratio Cl/(Ti+Cl) between Ti and Cl is higher in the second region than in the first region. Due to controlling the concentration of chlorine in the thickness direction as described above, the $TiB_2$ layer of the present invention shows an excellent effect of significantly improving wear resistance and chipping resistance. This is because setting an amount of Cl to be relatively small in the first region results in higher hardness, and setting an amount of Cl to be relatively large in the second region results in improved sliding characteristic and followability. Namely, it is estimated that due to higher hardness in the first region, the force from the lateral direction of the tool can be resisted, and due to the improved sliding characteristic and followability in the second region, the adhering resistance to scraps attached to the surface is improved, and these interact synergistically, thereby obtaining the aforementioned excellent effect.

In contrast, when the amount of Cl is small throughout the $TiB_2$ layer, the hardness becomes high and thus the wear resistance is excellent, while the chipping resistance is reduced. On the other hand, when the amount of Cl is large throughout the $TiB_2$ layer, the adhesion and the wear resistance are both reduced.

A reason why the thickness of each of the first region and the second region is defined as 0.5 µm is that when the thickness is less than 0.5 µm, the atomic ratio Cl/(Ti+Cl) cannot be sufficiently specified in some cases, from the perspective of analytical accuracy. Therefore, from the perspective of analytical accuracy and from the perspective that the first region represents a region which most reflects the characteristics in the vicinity of the interface on the base material side and the second region represents a region which most reflects the characteristics in the vicinity of the interface on the coating film surface side, the thickness of each region is defined as 0.5 µm. When specifying the atomic ratio Cl/(Ti+Cl) in the first region and the second region, it is preferable to prevent a measurement error by obtaining an average value of numerical values (ratios) at different three or more points for each region.

As described above, the $TiB_2$ layer of the present invention is mainly composed of $TiB_2$ (titanium diboride) and also includes Cl, and by actively controlling the concentration of Cl which has been conventionally known as being present as a residue of the raw materials at the time of manufacturing, the aforementioned excellent effect has been successfully obtained. The manner of presence of such Cl included in the $TiB_2$ layer is not particularly limited. Cl and $TiB_2$ may be made into a solid solution, or may be present as a free atom or ion. Furthermore, even if the $TiB_2$ layer of the present invention contains inevitable impurities other than $TiB_2$ and Cl, the $TiB_2$ layer does not deviate the scope of the present invention.

In this case, it is preferable that the atomic ratio Cl/(Ti+Cl) is 0.00001 to 0.001 in the first region, and is 0.0001 to 0.01 in the second region. More preferably, the atomic ratio Cl/(Ti+Cl) is 0.00001 to 0.0008 in the first region, and is 0.0001 to 0.005 in the second region.

The atomic ratio Cl/(Ti+Cl) is set to be 0.00001 to 0.001 in the first region, and thereby, diffusion of Cl into the base material due to heat generated during formation of the coating film or during cutting process can be prevented and corrosion of the base material caused by the diffusion of Cl can be suppressed. As a result, adhesion between the base material and the coating film is improved, which allows improvement in chipping resistance.

On the other hand, the atomic ratio Cl/(Ti+Cl) is set to be 0.0001 to 0.01 in the second region, and thereby, embrittlement of the $TiB_2$ layer is suppressed and the high-temperature sliding characteristic is improved, and a friction coefficient with respect to the workpiece decreases, which allows improvement in wear resistance and chipping resistance.

Furthermore, it is suitable that the $TiB_2$ layer of the present invention has a thickness of 1 μm to 10 μm, and more preferably, 1.5 μm to 8 μm. When the thickness is less than 1 μm, the $TiB_2$ layer may not be able to sufficiently exert wear resistance in the continuous process. When the thickness exceeds 10 μm, chipping resistance may not be stabilized in intermittent cutting.

When the thickness of the $TiB_2$ layer exceeds 1 μm, an intermediate region is present between the aforementioned first and second regions. However, a composition (i.e., the atomic ratio Cl/(Ti+Cl)) of this intermediate region is not particularly limited. Such a composition of the intermediate region may be the same as the composition of the aforementioned first region, or may be the same as the composition of the aforementioned second region. Alternatively, the intermediate region may have an intermediate composition between those of the aforementioned first and second regions. Furthermore, the composition of the intermediate region may be lower than the atomic ratio Cl/(Ti+Cl) in the aforementioned first region, or may be higher than the atomic ratio Cl/(Ti+Cl) in the aforementioned second region. Such a composition of the intermediate region may vary in the thickness direction.

In the aforementioned $TiB_2$ layer of the present invention, chipping is suppressed that occurs when various types of workpieces including a difficult-to-cut material such as a Ti alloy are cut, and adhesion to the base material and the other layers is improved. Therefore, the wear resistance and the chipping resistance are highly improved, and thus, the breakage resistance and the lifetime of the tool itself are improved.

<Other Layers>

The coating film of the present invention can include other layers as well as the $TiB_2$ layer described above. Examples of such other layers may include, but are not limited to, an underlying layer made of TiN, TiC, TiBN and the like and formed directly above the base material for further enhancing adhesion between the base material and the coating film, a TiCN layer formed between such an underlying layer and the $TiB_2$ layer for enhancing adhesion therebetween, an $Al_2O_3$ layer formed on the $TiB_2$ layer for enhancing oxidation resistance, an intermediate layer made of TiCNO, TiBNO and the like and formed between the $Al_2O_3$ layer and the $TiB_2$ layer for enhancing adhesion therebetween, an outermost layer made of TiN, TiCN, TiC and the like and formed on the outermost surface of the coating film for indicating as to whether the cutting edge has been used or not, and the like.

The above-described other layers can generally be formed to have a thickness of 0.1 μm to 10 μm.

<Manufacturing Method>

The present invention also relates to a method of manufacturing a surface-coated cutting tool including a base material and a coating film that is formed on the base material and includes at least one $TiB_2$ layer. The manufacturing method includes the step of forming the $TiB_2$ layer. This step is a step of forming the $TiB_2$ layer with a chemical vapor deposition method by using a raw material gas including at least $TiCl_4$ (titanium tetrachloride) and $BCl_3$ (boron trichloride), and is characterized in that a molar ratio $TiCl_4/BCl_3$ between the $TiCl_4$ and the $BCl_3$ in the raw material gas is lower than 0.6 at the start of the step, and is equal to or higher than 0.6 at the end. In other words, the $TiB_2$ layer of the present invention described above can be formed by this manufacturing method.

In this way, according to the manufacturing method of the present invention, in the step of forming the $TiB_2$ layer, the molar ratio $TiCl_4/BCl_3$ between $TiCl_4$ and $BCl_3$ in the raw material gas is different between at the start of the step and at the end of the step, thereby allowing formation of the structure of the characteristic $TiB_2$ layer as described above. The detailed mechanism is not yet solved as to why the $TiB_2$ layer is configured to have a characteristic structure as described above by employing the above-described conditions. It is, however, conceivable that this is because when the crystals of the $TiB_2$ layer grow, the breakup state, the evaporation state and the desorption state of Cl of $TiCl_4$ and $BCl_3$ in the raw material gas change depending on the molar ratio between $TiCl_4$ and $BCl_3$, and as a result, a content ratio of Cl in the $TiB_2$ layer changes.

In this regard, as long as the molar ratio $TiCl_4/BCl_3$ is lower than 0.6 at the start of the step and is equal to or higher than 0.6 at the end, the $TiB_2$ layer having the configuration of the present invention can be obtained. However, the molar ratio may gradually change from the start to the end, or may be switched at any point in the step.

Furthermore, it is preferable that the molar ratio $TiCl_4/BCl_3$ shows a minimum numerical value at the start and shows a maximum numerical value at the end. However, the molar ratio $TiCl_4/BCl_3$ may show the minimum value and the maximum value at any point of the step.

Furthermore, when the $TiB_2$ layer of the present invention has the intermediate region between the first region and the second region as described above, the composition (i.e., the atomic ratio Cl/(Ti+Cl)) of this intermediate region shows a tendency to change depending on the aforementioned change in molar ratio $TiCl_4/BCl_3$ of the raw material gas.

When more specifically explaining the above-described manufacturing method, the raw material gas (which is also referred to as reaction gas) to be used in the step of forming the $TiB_2$ layer can be $TiCl_4$, $BCl_3$, $H_2$, and Ar. The molar ratio $TiCl_4/BCl_3$ between $TiCl_4$ and $BCl_3$ at the start of the step needs to be lower than 0.6, and further, is preferably lower than 0.5. This is because when the molar ratio is equal to or higher than 0.6, the atomic ratio Cl/(Ti+Cl) in the first region becomes higher than 0.001 and it becomes difficult to make the atomic ratio in the first region lower than the atomic ratio in the second region. It is preferable that the molar ratio $TiCl_4/BCl_3$ at the start of the step is equal to or higher than 0.1. This is because when the molar ratio $TiCl_4/BCl_3$ is lower than 0.1, the deposition rate of $TiB_2$ is significantly reduced and it may become difficult to generate the intended $TiB_2$ film.

On the other hand, the molar ratio $TiCl_4/BCl_3$ at the end of the step needs to be equal to or higher than 0.6, and further, is preferably equal to or higher than 1.0. This is because when the molar ratio is lower than 0.6, the atomic ratio Cl/(Ti+Cl) in the second region becomes lower than 0.001 and it becomes difficult to make the atomic ratio in the second region higher than the atomic ratio in the first region. It is preferable that the molar ratio $TiCl_4/BCl_3$ at the end of the step is equal to or lower than 10. This is because when the molar ratio exceeds 10, the atomic ratio Cl/(Ti+Cl) in the second region exceeds 0.01 and the $TiB_2$ layer shows a tendency to become brittle. Furthermore, the reaction efficiency is extremely reduced and a large amount of unreacted substances are deposited, and the reaction operation itself may not be able to continue.

As described above, the molar ratio $TiCl_4/BCl_3$ of the raw material gas is set to be higher at the end of the step of forming the $TiB_2$ layer than at the start, thereby allowing formation of the $TiB_2$ layer having the aforementioned structure.

It is preferable that $H_2$ in the aforementioned raw material gas is set at about 70 mol % to 99 mol %, and Ar is set at about 0 mol % to 20 mol % (i.e., Ar may not be included in some cases). As described above, $H_2$ and Ar occupy a major part of the raw material gas in terms of volume ratio.

Furthermore, the reaction temperature in this step is set at 800° C. to 950° C., and more preferably, at 850° C. to 900° C. When the reaction temperature is less than 800° C., it becomes difficult to form the $TiB_2$ layer having the characteristics of the present invention. When the reaction temperature exceeds 950° C., $TiB_2$ is coarsely granulated or a strong η layer (WCoB layer) and a boron-containing brittle layer (CoB layer) may be generated if the base material is made of cemented carbide. In this regard, the manufacturing method of the present invention provides an excellent effect that generation of a strong η layer and a boron-containing brittle layer can be prevented.

With regard to the $TiB_2$ layer according to the present invention, as long as the above-described conditions are employed, other conditions such as a pressure can be employed without particularly limiting the conventionally known conditions. In addition, when the coating film of the present invention includes layers other than the $TiB_2$ layer, these layers can be formed by the conventionally known chemical vapor deposition method and physical vapor deposition method. Although the formation method thereof is not particularly limited, it is preferable to form these layers by the chemical vapor deposition method in terms of the fact that these layers can be formed consecutive with the $TiB_2$ layer within one chemical vapor deposition apparatus.

EXAMPLES

Although the present invention will be hereinafter described in greater detail with reference to Examples, the present invention is not limited thereto.

<Preparation of Base Material>

Base materials A and B shown in the following Table 1 were prepared. Specifically, the raw material powder having a blending composition shown in Table 1 was uniformly mixed, and pressurized and molded in a predetermined shape, which was then sintered at 1300° C. to 1500° C. for 1 to 2 hours, thereby achieving a base material made of cemented carbide formed in two types of shapes including CNMG120408NUX and SEET13T3AGSN-G. In other words, two types of different shapes were prepared fir each base material.

The above-described two types of shapes each are manufactured by Sumitomo Electric Hardmetal Corp. CNMG120408NUX has a shape of a cutting edge replaceable-type cutting tip for turning while SEET13T3AGSN-G has a shape of a cutting edge replaceable-type cutting tip for rotary cutting (milling).

TABLE 1

| | Blending Composition (% by Mass) | | | |
|---|---|---|---|---|
| | Co | $Cr_3C_2$ | TaC | WC |
| A | 5.2 | 0.5 | — | Remainder |
| B | 10.0 | — | 2.0 | Remainder |

<Formation of Coating Film>

The coating film was formed on the surface of the base material prepared as described above. Specifically, the base material was placed within the chemical vapor deposition apparatus to thereby form the coating film on the base material by the chemical vapor deposition method. The formation conditions of the coating film are as described in the following Tables 2 and 3, and the film formation time was adjusted to achieve each thickness described in Table 4. Table 2 shows the formation conditions of each layer other than the $TiB_2$ layer, and Table 3 shows the formation conditions of the $TiB_2$ layer. In addition, TiBNO and TiCNO in Table 2 each are an intermediate layer in Table 4 described later, and other compounds also correspond to layers, respectively, in Table 4 other than the $TiB_2$ layer.

Also as shown in Table 3, there are 7 types of formation conditions "a" to "e" and "x" to "y" for the $TiB_2$ layer, in which conditions "a" to "e" are the conditions in accordance with the method of the present invention while conditions "x" to "y" are the conditions in accordance with Comparative Examples (the conventional technique). Furthermore, the raw material gas composition described in the section of "At the Start" was used in the first half of the entire film formation time for forming the $TiB_2$ layer, and the raw material gas composition described in the section of "At the End" was used in the latter half.

For example, the formation condition "a" shows that the raw material gas (reaction gas) having a composition including 2.0 mol % of $TiCl_4$, 3.7 mol % of $BCl_3$ and 94.3 mol % of $H_2$ was used in the first half and the raw material gas (reaction gas) having a composition including 2.5 mol % of $TiCl_4$, 3.7 mol % of $BCl_3$ and 93.8 mol % of $H_2$ was used in the latter half, to form the $TiB_2$ layer by the chemical vapor deposition method under the conditions of a pressure of 80.0 kPa and a temperature of 850° C. The molar ratio $TiCl_4/BCl_3$ in each raw material gas composition is as shown in Table 3. The composition at the start of the step of forming the $TiB_2$ layer is the composition described in "At the Start" in Table 3, and the composition at the end is the composition described in "At the End" in Table 3.

In addition, each layer other than the $TiB_2$ layer shown in Table 2 was also similarly formed except that the raw material gas composition was not changed during film formation. It is to be noted that the "remainder" in Table 2 shows that $H_2$ occupies the remainder of the raw material gas (reaction gas). Furthermore, "total gas amount" indicates the total volume flow rate at which gas is introduced into a CVD oven per unit time, assuming that the gas in the standard condition (0° C., 1 atmosphere) is ideal gas.

Furthermore, the composition (including the atomic ratio Cl/(Cl+Ti) in the $TiB_2$ layer) of each coating film was checked by SEM-EDX (scanning electron microscope-energy dispersive X-ray spectroscopy). As the atomic ratio Cl/(Cl+Ti) in each of the first region and the second region, an average value of values obtained by measuring the atomic ratio at three points for each region was used. The results thereof are shown in Table 3.

<Critical Peel Stress of $TiB_2$ Layer>

A critical peel stress of the $TiB_2$ layer was measured as follows.

First, the surface of the base material made of cemented carbide and having either one of the aforementioned shapes was polished (Ra<0.05 μm), and thereafter, the $TiB_2$ layer having a thickness of 5 μm was directly formed on the base material under the conditions described in Table 3. Then, a diamond indenter whose tip had a curvature radius of 0.2 mm was pressed onto the $TiB_2$ layer, to scratch the $TiB_2$ layer while increasing the load, and a load value when the $TiB_2$ layer was peeled off was obtained. This was defined as a critical peel stress (N). A larger numerical value of this critical peel stress shows that the adhesion to the base material is more excellent. The results thereof are shown in Table 3.

In the foregoing, the load was set at 0 to 100 N and the load increase speed was set at 1 N/mm. Furthermore, the peel-off point was identified by observation with an A. E wave (Acoustic Emission wave) and an SEM, and a movement distance of the diamond indenter until the peel-off occurred was measured, to obtain the critical peel stress.

TABLE 2

| Raw Material Gas Composition (% by Volume) | | Film Formation Conditions | | |
|---|---|---|---|---|
| | | Pressure (kPa) | Temperature (°C.) | Total Gas Amount (L/min) |
| TiN (Underlying Layer) | $TiCl_4$ = 2.0%, $N_2$ = 39.7%, $H_2$ = Remainder | 6.7 | 915 | 63.8 |
| TiN (Outermost Layer) | $TiCl_4$ = 0.5%, $N_2$ = 41.2%, $H_2$ = Remainder | 79.8 | 980 | 45.9 |
| TiCN | $TiCl_4$ = 2.0%, $CH_3CN$ = 0.7%, $H_2$ = Remainder | 9 | 860 | 50.5 |
| TiBNO | $TiCl_4$ = 36.7%, $BCl_3$ = 0.1%, CO = 1.6%, $CO_2$ = 1.7%, $N_2$ = 61.7%, $H_2$ = Remainder | 6.7 | 980 | 80.3 |
| TiCNO | $TiCl_4$ = 2.1%, CO = 3.2%, $CH_4$ = 2.8%, $N_2$ = 23.7%, $H_2$ = Remainder | 16.0 | 1030 | 70.5 |
| $Al_2O_3$ | $AlCl_3$ = 1.6%, $CO_2$ = 4.5%, $H_2S$ = 0.2%, HCl = 3.5%, $H_2$ = Remainder | 6.7 | 1000 | 46.2 |

TABLE 3

| | | At the Start | | At the End | | Film Formation Conditions | | Characteristics of the $TiB_2$ Layer | | |
|---|---|---|---|---|---|---|---|---|---|---|
| | | Raw Material Gas Composition (mol %) | Molar Ratio ($TiCl_4$/$BCl_3$) | Raw Material Gas Composition (mol %) | Molar Ratio ($TiCl_4$/$BCl_3$) | Pressure (kPa) | Temperature (°C.) | Atomic Ratio Cl/(Ti + Cl) | | Critical Peel Stress (N) |
| | | | | | | | | First Region | Second Region | |
| The Present Invention | a | $TiCl_4$ = 2.0%, $BCl_3$ = 3.7%, $H_2$ = 94.3% | 0.54 | $TiCl_4$ = 2.5%, $BCl_3$ = 3.7%, $H_2$ = 93.8% | 0.68 | 80.0 | 850 | 0.0006 | 0.0012 | 55.0 |
| | b | $TiCl_4$ = 1.0%, $BCl_3$ = 3.7%, $H_2$ = 95.3% | 0.27 | $TiCl_4$ = 1.0%, $BCl_3$ = 0.4%, $H_2$ = 98.6% | 2.50 | 97.0 | 900 | 0.0005 | 0.0015 | 60.0 |
| | c | $TiCl_4$ = 1.0%, $BCl_3$ = 5.1%, Ar = 17%, $H_2$ = 77.9% | 0.20 | $TiCl_4$ = 5.1%, $BCl_3$ = 1.0%, Ar = 17%, $H_2$ = 76.9% | 5.10 | 90.0 | 830 | 0.0004 | 0.0017 | 58.0 |
| | d | $TiCl_4$ = 0.4%, $BCl_3$ = 4.0%, Ar = 17%, $H_2$ = 78.6% | 0.10 | $TiCl_4$ = 2.9%, $BCl_3$ = 0.7%, Ar = 17%, $H_2$ = 79.4% | 4.14 | 85.0 | 880 | 0.0008 | 0.0014 | 63.0 |
| | e | $TiCl_4$ = 3.0%, $BCl_3$ = 5.1%, Ar = 46.3%, $H_2$ = 45.6% | 0.59 | $TiCl_4$ = 1.9%, $BCl_3$ = 0.2%, Ar = 46.3%, $H_2$ = 51.6% | 9.50 | 87.0 | 800 | 0.0006 | 0.0020 | 55.0 |
| Comparative Example | x | $TiCl_4$ = 0.4%, $BCl_3$ = 0.7%, Ar = 88.9%, $H_2$ = 10% | 0.57 | $TiCl_4$ = 0.4%, $BCl_3$ = 0.7%, Ar = 88.9%, $H_2$ = 10% | 0.57 | 101.3 | 800 | 0.0007 | 0.0007 | 45.0 |
| | y | $TiCl_4$ = 0.22%, $BCl_3$ = 0.04%, $H_2$ = 99.74% | 5.50 | $TiCl_4$ = 0.22%, $BCl_3$ = 0.04%, $H_2$ = 99.74% | 5.50 | 101.3 | 1000 | 0.0004 | 0.0004 | 40.0 |

<Production of Surface-Coated Cutting Tool>

A coating film was formed on a base material by the conditions in Tables 2 and 3 shown above, thereby producing surface-coated cutting tools (two types (the shape of the base material is different) of cutting edge replaceable-type cutting tips for each coating film) of Examples 1 to 20 and Comparative Examples 1 to 7 shown in the following Table 4.

For example, the table shows that the surface-coated cutting tool of Example 4 has a configuration, in which base material A shown in Table 1 was employed as a base material, to form a TiN layer having a thickness of 0.5 μm as an underlying layer on the surface of base material A under the conditions shown in Table 2, on which a TiCN layer having a thickness of 4.0 μm was formed under the conditions shown in Table 2, on which a $TiB_2$ layer having a thickness of 3.5 μm was formed under the formation condition "c" in Table 3, on which a TiBNO layer having a thickness of 0.5 μm as an intermediate layer, an $Al_2O_3$ layer having a thickness of 2.5 μm and a TiN layer having a thickness of 1.0 μm as an outermost layer were formed in this order under the conditions shown in Table 2, to thereby form a coating film having a total thickness of 12.0 μm on the base material.

In addition, since all of the $TiB_2$ layers of Comparative Examples 1 to 7 are formed under the conditions of the conventional technique that is not based on the method of the present invention, these $TiB_2$ layers do not show the configuration similar to that of the present invention (i.e., the atomic ratio Cl/(Ti+Cl) does not change and is fixed in the thickness direction. See Table 3).

It is to be noted that each of blank columns in Table 4 shows that the relevant layer is not formed.

to the state of normal wear, the more excellent the chipping resistance is.

<Cutting Conditions>

Workpiece: cutting outer periphery of Ti6Al4V round bar

Circumferential speed: 60 m/min

Feeding speed: 0.15 mm/rev

Cutting amount: 1.0 mm

Cutting fluid: existing

TABLE 4

| | | Configuration of Coating Film | | | | | | |
|---|---|---|---|---|---|---|---|---|
| | Type of Base Material | Underlying Layer (TiN Layer) (μm) | TiCN Layer (μm) | $TiB_2$ Layer (μm) | Intermediate Layer (μm) | $Al_2O_3$ Layer (μm) | Outermost Layer (TiN Layer) (μm) | Total Thickness of Coating Film (μm) |
| Example 1 | A | 1.5 | — | a(5.5) | — | — | — | 7.0 |
| Example 2 | A | 1.3 | — | e(5.2) | — | — | — | 6.5 |
| Example 3 | A | 1.0 | 2.2 | b(4.0) | — | — | 0.5 | 7.7 |
| Example 4 | A | 0.5 | 4.0 | c(3.5) | TiBNO(0.5) | 2.5 | 1.0 | 12.0 |
| Example 5 | B | 0.5 | 1.7 | a(3.0) | TiBNO(0.5) | 1.5 | — | 7.2 |
| Example 6 | A | 0.3 | 3.6 | d(2.2) | TiBNO(0.3) | 1.5 | — | 7.9 |
| Example 7 | A | 0.6 | 2.4 | d(7.0) | TiBNO(0.5) | 2.2 | — | 12.7 |
| Example 8 | B | 1.9 | 2.0 | b(2.7) | TiBNO(0.5) | 1.0 | — | 8.1 |
| Example 9 | B | 1.7 | 1.8 | c(4.5) | TiBNO(0.5) | 0.5 | — | 9.0 |
| Example 10 | A | 1.5 | 3.6 | a(3.2) | TiBNO(0.3) | 2.5 | — | 11.1 |
| Example 11 | B | 1.0 | — | e(4.5) | TiCNO(0.4) | 1.6 | — | 7.5 |
| Example 12 | B | 1.0 | 3.4 | b(2.5) | TiBNO(0.8) | 1.0 | — | 8.7 |
| Example 13 | A | 0.8 | — | a(4.7) | TiBNO(0.4) | 2.2 | — | 8.1 |
| Example 14 | B | 1.3 | 1.8 | c(3.4) | TiBNO(0.5) | 1.0 | — | 8.0 |
| Example 15 | B | 1.1 | — | c(3.1) | TiBNO(0.3) | 1.6 | — | 6.1 |
| Example 16 | A | 2.0 | — | e(4.2) | TiBNO(0.4) | 2.1 | — | 8.7 |
| Example 17 | A | 0.9 | 4.3 | e(3.0) | TiBNO(0.5) | 2.0 | — | 10.7 |
| Example 18 | B | 1.5 | — | a(4.0) | — | — | — | 5.5 |
| Example 19 | B | 1.0 | 1.5 | d(1.5) | TiBNO(0.5) | 2.6 | 1.0 | 8.1 |
| Example 20 | B | 1.5 | — | e(4.8) | — | — | — | 6.3 |
| Comparative Example 1 | A | 1.5 | — | x(5.1) | — | — | — | 6.6 |
| Comparative Example 2 | A | 1.3 | 2.7 | y(3.3) | TiBNO(0.5) | 2.2 | 1.0 | 11.0 |
| Comparative Example 3 | A | 1.0 | — | x(6.5) | TiBNO(0.4) | 2.5 | 1.0 | 11.4 |
| Comparative Example 4 | B | 0.9 | 1.7 | y(3.0) | TiCNO(0.7) | 1.8 | — | 8.1 |
| Comparative Example 5 | B | 0.8 | 7.0 | y(2.5) | TiBNO(0.5) | 2.5 | — | 13.3 |
| Comparative Example 6 | B | 1.6 | 3.0 | x(2.8) | TiBNO(0.4) | 1.0 | — | 8.8 |
| Comparative Example 7 | B | 1.5 | — | x(7.0) | TiCNO(0.6) | 1.3 | — | 10.4 |

<Cutting Test>

The surface-coated cutting tools obtained as described above were used to perform four types of cutting tests as described below.

<Cutting Test 1>

With regard to each of the surface-coated cutting tools (those having a shape of CNMG120408NUX were used) of Examples and Comparative Examples shown in the following Table 5, the cutting time until the wear amount of the flank face (Vb) reached 0.25 mm under the following cutting conditions was measured, and the final damage state of the cutting edge was observed. The results thereof are shown in Table 5. The results show that the longer the cutting time is, the more excellent the wear resistance is. Furthermore, the results also show that the more the final damage state is close

TABLE 5

| | Cutting Time (Minute) | Final Damage State |
|---|---|---|
| Example 1 | 17.0 | Normal Wear |
| Example 2 | 15.0 | Normal Wear |
| Example 3 | 19.0 | Normal Wear |
| Example 7 | 20.0 | Normal Wear |
| Example 16 | 18.0 | Normal Wear |
| Comparative Example 1 | 8.0 | Breakage |
| Comparative Example 3 | 10.0 | Normal Wear |

As can be seen from Table 5, it is apparent that the surface-coated cutting tools of Examples of the present invention are excellent both in wear resistance and chipping resistance as compared to the surface-coated cutting tools of Comparative Examples Furthermore, in the final damage state in Table 5, "normal wear" means a damage state caused only by wearing without occurrence of chipping, breakage and the like (having a smooth wearing surface), and "breakage" means a large chipped portion occurring in the cutting edge portion.

<Cutting Test 2>

With regard to each of the surface-coated cutting tools (those having a shape of CNMG120408NUX were used) of Examples and Comparative Examples shown in the following Table 6, the cutting time until the wear amount of the flank face (Vb) reached 0.25 mm under the following cutting conditions was measured, and the final damage state of the cutting edge was observed. The results thereof are shown in Table 6. The results show that the longer the cutting time is, the more excellent the wear resistance is. The results also show that the more the final damage state is close to the state of normal wear, the more excellent the chipping resistance is.

<Cutting Conditions>

Workpiece: cutting outer periphery of INCONEL 718 round bar
  Circumferential speed: 50 m/min
  Feeding speed: 0.15 mm/rev
  Cutting amount: 1.0 mm
  Cutting fluid: existing

TABLE 6

|  | Cutting Time (Minute) | Final Damage State |
|---|---|---|
| Example 4 | 20.0 | Normal Wear |
| Example 6 | 18.0 | Normal Wear |
| Example 10 | 15.0 | Micro-Breakage of Front Boundary |
| Example 13 | 17.0 | Normal Wear |
| Example 17 | 23.0 | Normal Wear |
| Comparative Example 2 | 10.0 | Micro-Chipping of Front Boundary |

As can be seen from Table 6, it is apparent that the surface-coated cutting tools of Examples of the present invention are excellent both in wear resistance and chipping resistance as compared to the surface-coated cutting tools of Comparative Examples.

In the final damage state in Table 6, "normal wear" means a damage state caused only by wearing without occurrence of chipping, breakage and the like (having a smooth wearing surface), "micro-breakage of front boundary" means an extremely small chipped portion occurring in the cutting edge portion forming a finished surface in which the base material is recognized as being exposed, and "micro-chipping of front boundary" means an extremely small chipped portion occurring in the cutting edge portion forming a finished surface.

<Cutting Test 3>

With regard to each of the surface-coated cutting tools (those having a shape of SEET13T3AGSN-G were used) of Examples and Comparative Examples shown in the following Table 7, the pass frequency and the cutting distance until the breakage occurred or the wear amount of the flank face (Vb) reached 0.25 mm under the following cutting conditions were measured, and the final damage state of the cutting edge was observed. The results thereof are shown in Table 7.

In addition, the pass frequency is the repeated number of times of the operation repeatedly performed, in which one side surface (a surface of 300 mm×80 mm) of the workpiece described below (shape: a block, of 300 mm×100 mm×80 mm) is rotary cut from its one end to the other end by a cutter attached with one surface-coated cutting tool (cutting edge replaceable-type cutting tip) (it is to be noted that the pass frequency having a number with a decimal point indicates that the above-mentioned conditions are satisfied in the middle of the course from one end to the other end). In addition, the cutting distance means the total distance of the workpiece that has been cut until the above-described conditions were satisfied, and corresponds to the product of the pass frequency and the length of the side surface mentioned above (300 mm).

The results show that the greater the pass frequency is (that is, the longer the cutting distance is), the more excellent the wear resistance is. Furthermore, the results also show that the more the final damage state is close to the state of normal wear, the more excellent the chipping resistance is.

<Cutting Conditions>

Workpiece: Ti6Al4V block material
  Circumferential speed: 70 m/min
  Feeding speed: 0.3 mm/s
  Cutting amount: 1.0 mm
  Cutting fluid: existing
  Cutter: WGC4160R (manufactured by Sumitomo Electric Hardmetal Corp.)
  Number of attached tips: 1

TABLE 7

|  | Pass Frequency | Cutting Distance (m) | Final Damage State |
|---|---|---|---|
| Example 5 | 19.5 | 5.9 | Normal Wear |
| Example 12 | 20.0 | 6.0 | Normal Wear |
| Example 14 | 23.8 | 7.1 | Breakage |
| Example 15 | 20.6 | 6.2 | Normal Wear |
| Example 20 | 22.0 | 6.6 | Normal Wear |
| Comparative Example 4 | 7.5 | 2.3 | Breakage |
| Comparative Example 6 | 13.8 | 4.1 | Normal Wear |

As can be seen from Table 7, it is apparent that the surface-coated cutting tools of Examples of the present invention are excellent both in wear resistance and chipping resistance as compared to the surface-coated cutting tools of Comparative Examples In addition, in the final damage state in Table 7, "normal wear" means a damage state caused only by wearing without occurrence of chipping, breakage and the like (having a smooth wearing surface), and "breakage" means a large chipped portion occurring in the cutting edge portion.

<Cutting Test 4>

With regard to each of the surface-coated cutting tools (those having a shape of SEET13T3AGSN-G were used) of Examples and Comparative Examples shown in the following Table 8, the pass frequency and the cutting distance until the breakage occurred or the wear amount of the flank face (Vb) reached 0.25 mm under the following cutting conditions were measured, and the final damage state of the cutting edge was observed. The results thereof are shown in Table 8.

In addition, as in Cutting Test 3, the pass frequency is the repeated number of times of the operation repeatedly performed, in which one side surface (a surface of 300 mm×80 mm) of the workpiece described below (shape: a block of 300 mm×100 mm×80 mm) is rotary cut from its one end to the other end by a cutter attached with one surface-coated cutting tool (cutting edge replaceable-type cutting tip) (it is to be noted that the pass frequency having a number with a decimal point indicates that the above-mentioned conditions are satisfied in the middle of the course from one end to the other end). As in Cutting Test 3, the cutting distance also means the total distance of the workpiece that has been cut until the above-described conditions were satisfied, and corresponds to the product of the pass frequency and the length of the side surface mentioned above (300 mm).

The results show that the greater the pass frequency is (that is, the longer the cutting distance is), the more excellent the wear resistance is. Furthermore, the results also show that the more the final damage state is close to the state of normal wear, the more excellent the chipping resistance is.

<Cutting Conditions>
Workpiece: SUS304 block material
Circumferential speed: 150 m/min
Feeding speed: 0.3 mm/s
Cutting amount: 2.0 mm
Cutting fluid: existing
Cutter: WGC4160R (manufactured by Sumitomo Electric Hardmetal Corp.)
Number of attached tips: 1

TABLE 8

|  | Pass Frequency | Cutting Distance (m) | Final Damage State |
| --- | --- | --- | --- |
| Example 8 | 12.6 | 3.8 | Normal Wear |
| Example 9 | 10.0 | 3.0 | Breakage |
| Example 11 | 13.5 | 4.1 | Normal Wear |
| Example 18 | 12.0 | 3.6 | Normal Wear |
| Example 19 | 15.0 | 4.5 | Normal Wear |
| Comparative Example 5 | 2.8 | 0.8 | Breakage |
| Comparative Example 7 | 8.0 | 2.4 | Normal Wear |

As can be seen from Table 8, it is apparent that the surface-coated cutting tools of Examples of the present invention are excellent both in wear resistance and chipping resistance as compared to the surface-coated cutting tools of Comparative Examples.

In addition, in the final damage state in Table 8, "normal wear" means a damage state caused only by wearing without occurrence of chipping, breakage and the like (having a smooth wearing surface), and "breakage" means a large chipped portion occurring in the cutting edge portion.

Although the embodiments and examples of the present invention have been explained as described above, it is also intended from the beginning to combine the configurations of the above-described embodiments and examples as appropriate.

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

The invention claimed is:

1. A surface-coated cutting tool comprising:
a base material; and
a coating film formed on said base material,
said coating film including at least one $TiB_2$ layer,
said $TiB_2$ layer including Cl together with $TiB_2$, and
assuming that in said $TiB_2$ layer, a first region represents a region having a thickness of 0.5 μm from an interface on said base material side, and a second region represents a region having a thickness of 0.5 μm from an interface on said coating film surface side, an atomic ratio Cl/(Ti+Cl) between Ti and Cl being higher in said second region than in said first region.

2. The surface-coated cutting tool according to claim 1, wherein
said atomic ratio Cl/(Ti+Cl) is 0.00001 to 0.001 in said first region, and is 0.0001 to 0.01 in said second region.

3. The surface-coated cutting tool according to claim 1, wherein
said $TiB_2$ layer has a thickness of 1 to 10 μm.

4. A method of manufacturing a surface-coated cutting tool including a base material and a coating film formed on said base material, said coating film including at least one $TiB_2$ layer, said method comprising the step of:
forming said $TiB_2$ layer,
said step being a step of forming said $TiB_2$ layer with a chemical vapor deposition method by using a raw material gas including at least $TiCl_4$ and $BCl_3$, and
a molar ratio $TiCl_4/BCl_3$ between said $TiCl_4$ and said $BCl_3$ in said raw material gas being lower than 0.6 at the start of said step, and being equal to or higher than 0.6 at the end.

* * * * *